(12) United States Patent
Lee et al.

(10) Patent No.: US 8,065,106 B2
(45) Date of Patent: Nov. 22, 2011

(54) MOVING LIGHT TABLE

(75) Inventors: Robin Lee, Hamburg, NJ (US); Chris Conti, West New York, NJ (US)

(73) Assignee: Production Resource Group, LLC, New Windsor, NY (US)

( * ) Notice: Subject to any disclaimer, the term of this patent is extended or adjusted under 35 U.S.C. 154(b) by 476 days.

(21) Appl. No.: 11/945,225

(22) Filed: Nov. 26, 2007

(65) Prior Publication Data
US 2008/0162064 A1    Jul. 3, 2008

Related U.S. Application Data

(60) Provisional application No. 60/867,382, filed on Nov. 27, 2006.

(51) Int. Cl.
*G01R 31/00* (2006.01)
*G01B 5/00* (2006.01)
*F21S 8/00* (2006.01)
*F21S 2/00* (2006.01)
*F21S 8/04* (2006.01)
*B65G 47/24* (2006.01)
*B65G 47/00* (2006.01)

(52) U.S. Cl. ......... 702/117; 702/33; 362/418; 362/427; 362/419; 198/373; 198/379

(58) Field of Classification Search .......... 702/81, 702/150, 151, 94, 33; 324/405–408; 356/72–73, 356/139.03–139.06, 399–400; 198/502.1, 502.3, 493–494, 339.1, 340, 374–377.03, 377.06, 377.07, 377.1, 343.1, 343.2, 370.01–370.06, 373, 375, 376, 379, 383; 362/418, 427, 419

See application file for complete search history.

(56) References Cited

U.S. PATENT DOCUMENTS

| 4,716,344 | A  | * | 12/1987 | Newell et al. | 315/312 |
| 4,980,806 | A  | * | 12/1990 | Taylor et al. | 362/85 |
| 6,008,636 | A  | * | 12/1999 | Miller et al. | 324/158.1 |
| 7,505,064 | B2 | * | 3/2009  | Knoedgen et al. | 348/187 |
| 2001/0017253 | A1 | * | 8/2001 | Patel et al. | 198/493 |

* cited by examiner

*Primary Examiner* — Michael Nghiem
*Assistant Examiner* — Ricky Ngon
(74) *Attorney, Agent, or Firm* — Law Office of Scott C. Harris, Inc.

(57) ABSTRACT

A moving light test system allows connecting moving lights to an interface board and conveying the lights and orienting and testing the lights while they are attached to the board. The lights can be mechanically and electrically connected to the board, and once connected, can be tested in multiple ways without reconfiguring or removing the lights. The board has a connector that can be plugged in at various locations, and the board can also be handled by mechanical devices. In this way, once the light is connected to the board, it does not need to be re-handled. In addition, lights can be tested in different orientations.

17 Claims, 3 Drawing Sheets

MOVING LIGHT TABLE

This application claims priority from U.S. provisional application No. 60/867,382, filed Nov. 27, 2006, the disclosure of which is herewith incorporated by reference.

BACKGROUND

Lights for stage and production operations are often heavy and awkward. These lights are intended to be remotely controlled, and also to project a high intensity light. The lights often include special bulbs and ballasts. The lights are mountable on trusses, but often very difficult to handle. Many devices, for example, require two men to carry them.

The lights are often rented, and after the rental is completed, they must be tested to be readied for the next rental. This means testing the lights.

SUMMARY

The present application teaches a special moving table and system that allows the lights to be automatically handled, tested and cleaned.

DETAILED DESCRIPTION

The general structure and techniques, and more specific embodiments which can be used to effect different ways of carrying out the more general goals, are described herein.

This application recognizes that multiple handling of lights after a rental or other hire is inefficient. According to the present system, a device is disclosed which allows manually handling the lights only a single time, after which the lights are automatically processed. In an embodiment, the lights are attached both mechanically and electrically to an interface board that allows the lights to be electronically handled and also tested.

The embodiment refers to handling and control of "moving lights", which in an embodiment are devices that are remotely controllable to move in pan and tilt directions, based on controls from a remote console. Moving lights also have beam parameters, like hue, saturation, beam size, intensity, and pattern that are all remote controllable as well as the above referenced pan and tilt. The moving lights may be of a type that has a base connection, and a moving head that is connected to and controlled by electronics in the base connection.

In an embodiment, a crane or other comparable device can be used to handle the lights. For example, the crane can be maneuvered to turn the lights upside down, an otherwise difficult operation. The crane can also be used to raise and lower the lights in and out of road cases and on and off the table.

Figure 1A:
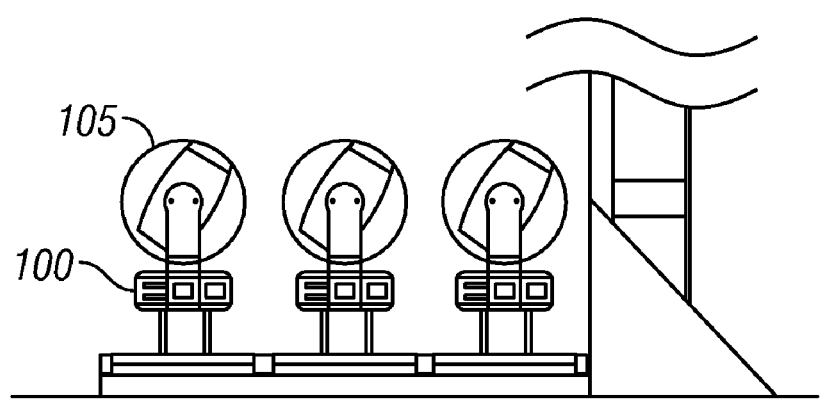
FIGS. 1A-1C show handling of the lights.
Figure 1B:
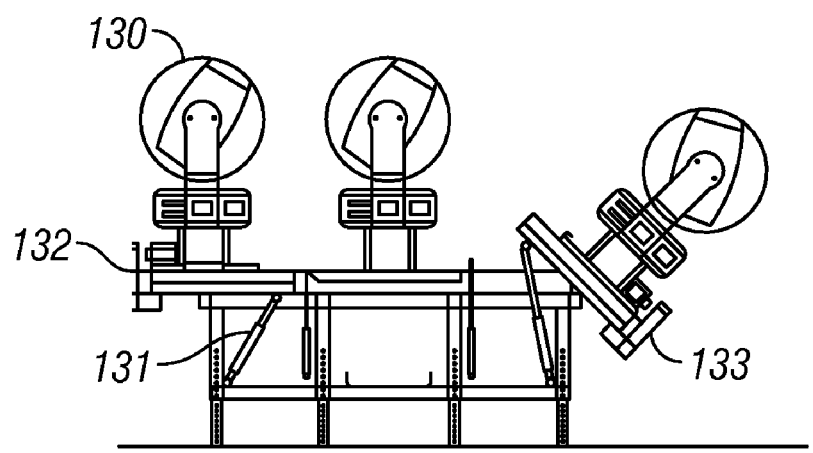
Figure 1C:
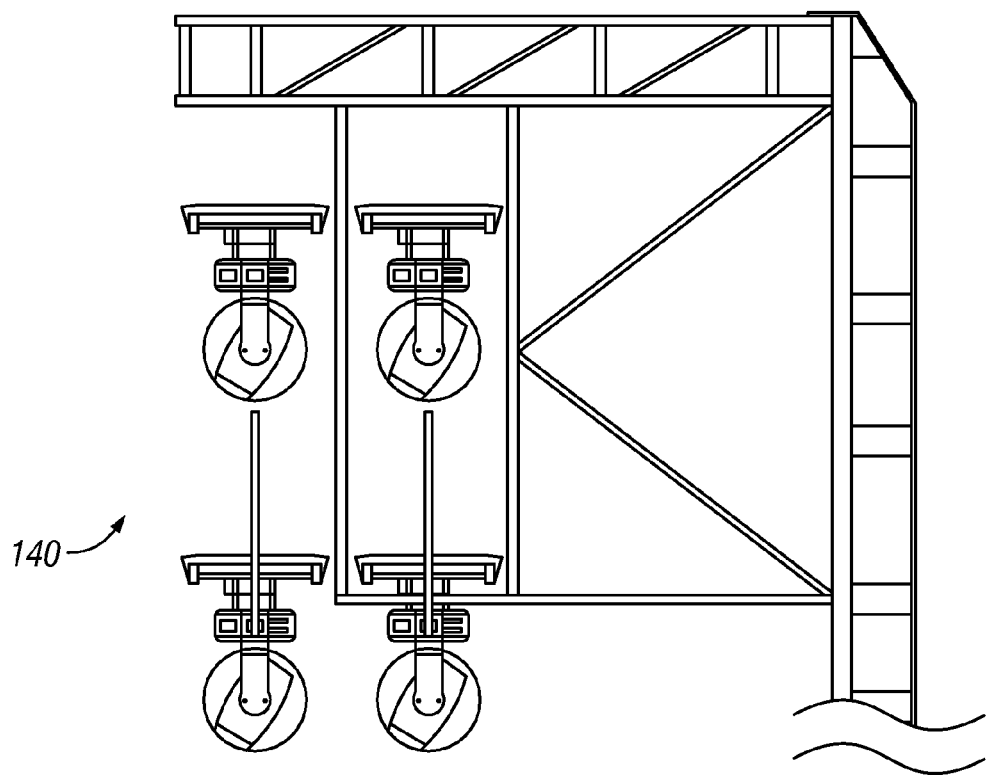

FIGS. 1A-1C illustrate an embodiment that shows the way that the lights are handled.

When the lights are first removed from the truck or other transportation device, they are usually placed "upside down", with the light part facing up, as shown in FIG. 1A. The lights are formed of two parts: a base part such as 100, and a moving light producing part 105. The light producing part 105 is movable relative to the base part 100. When the lights are hung on trusses, the base part is connected to the truss, while the moving light producing part 105 is controlled by and moved relative to the truss. However, the base part 100 is often much heavier than the moving part (since the control part forms the anchor and never really needs to move). Accordingly, the lights can be maneuvered to place the control part downward. However, this is not the position in which the lights will be used, and hence this may not be the optimum position to test those lights.

Figure 2:
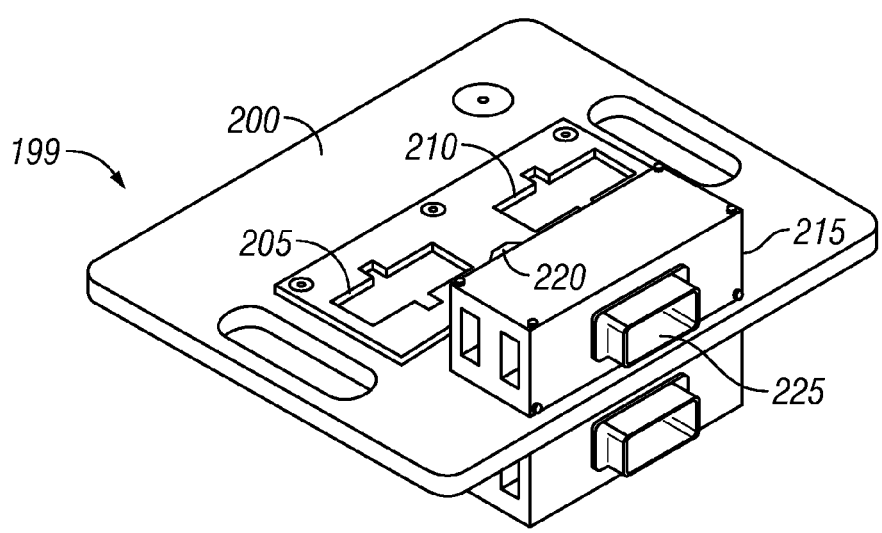
FIG. 2 shows an interface board.

In the embodiment, the lights are attached to a special interface board which is shown in FIG. 2. The interface board is referred to as a "boogie board". The boogie board includes a light mounting surface 200, and also includes a connection portion 205 which includes connections that can make a connection to portions of the light which normally interface to the clamps that are used to hang the light. The light is connected to the connection portions 205, 210. The connection is then tightened to be thereby held on the interface board. An electrical connector portion 215 includes a light interfacing connector part 220, and a test interfacing connector part 225. These two connectors may be configurable depending on the light which is used, for example. The light interfacing connector 220 connects to the light which is attached to the board 200. This provides power and control signals on the light's normal connectors for power and data. The power and control may be a generic connector with pigtail connections that are intended for use with multiple different devices, or it may be specific connectors that are directly connected into connectors on the light.

There may be more than two connectors on the Plug box, e.g., an XLR 5 pin for DMX, AMP 19 pin connector for Vari-Lite S300 lights that need Low voltage power, communication, and bulb power. An L620 connector may be provided for 208 volt power, a stagepin connector for 110 volt non dim power, another stagepin connector for 110 volt dimming, and finally an RJ45 Ethernet connector. More generally, there may be multiple connectors for multiple types of power and data configurations.

For example, the connectors may provide XLR connections for the DMX connection, and may also provide standard kinds of power connections. Connector 225 may similarly be configured in this way.

Once the light is connected on the interface board 199, it can be automatically handled using a crane or winch. FIG. 1B illustrates how the lights can be placed on a table which allows the lights to be moved and tilted. The light 130 is placed on the table in a position where it can be moved along the table. The table also includes tiltable support parts, each controllable by a hydraulic arm 131, which more generally may be, pneumatic, vacuum, or electromagnetic. When the arm 131 is extended, the table is tilted as shown in 133, causing the light to be tilted under power. The light can then be tested in the tilted position. This position is closer to the light's normal operating position, and hence this may be a more realistic way of testing the light's operation. This also puts the maximum amount of physical strain on the light as well. If desired, the lights on the boards can also be handled by a crane and hung from trusses for testing. 140 shows a group of lights being hung from trusses so that the lights can be tested in their normal position.

In this embodiment, the connectors are fully modular connectors, that can be configured in any desired way for any desired light. For example, the connectors may have configurable shapes, pins and other features.

Figure 3:
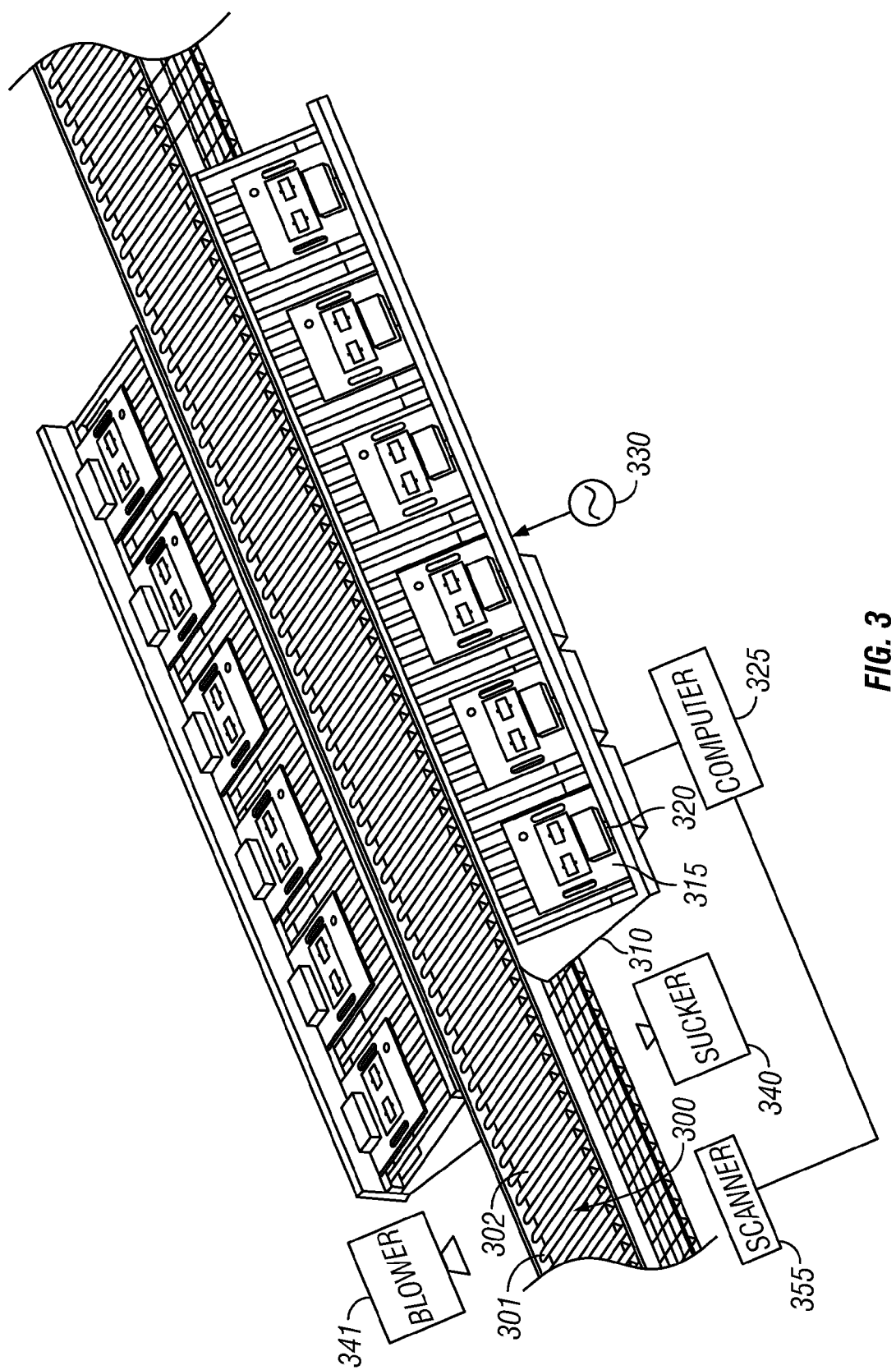
FIG. 3 illustrates the moving light table.

FIG. 3 illustrates the table and its test areas. The lights, on the interface boards, can be placed along the conveyor portion 300 of the table. The conveyor portion may move in an endless loop, moving the lights from one end to the other. Another embodiment may just form the conveyor as rollers along which the boards can be conveyed. In the embodiments, the conveyor portion is formed of slats 301 which allow open areas 302 in between adjacent slats. It may use rollers that are automated by rubber bands around the rollers and connected to a central line shaft with a single driving motor.

One or more testing stations such as 310 are provided. In the embodiment, the testing stations are hydraulically, pneumatically, vacuum, or electromagnetically controlled between a stowed position shown as 132 in FIG. 1B, and a tilted position shown as 133 in FIG. 1A. Each of the test stations have a provision for an interface board to be located, shown as 315. The provision for the interface board includes an electrical connection 320 which plugs into the test interfacing connector part 315. The board hence plugs into the connector 320 and allows powering up and testing the device in various ways. For example, a computer, shown as 325, may provide a test program for each light, either automatically or under operator control. A power source 330 also is connected to the connectors 320, and enables providing AC and/or DC power of various types to power the operations of the light.

In one embodiment, various sections along the conveyor include suction portions 340. The suction portions create a downdraft through the open areas 302 in the slats. There may also be blowers such as 341 which blow on the lights to further remove debris whenever possible. This forms an area which is a downdraft section. Other portions of the workstation may carry out other functions. For example, a barcode scanner 355 may scan a barcode or other identifying indicia on the light to determine information about the light such as its model number or any identifying characteristics.

Once the identifying information has been read, the identifying indicia can indicate specific information about the light. That information can be used to determine information about the light, e.g., directly, or by looking up the information from a database. The looked-up information can include, for example, format and/or type of power to the light, and format of control signals.

The output of the scanner 355 is connected into the computer, to assist the computer in this determination. Moreover, while the scanner is shown separated from the detection stations, it should be understood that the scanner can be located at the detection stations, such that each detection station has its own scanner to facilitate testing of individual lights. As an alternative to a scan, a machine vision device can be used.

In the embodiment, any crane can be used to move the devices, for example a hydraulic crane from Spanco.

Although only a few embodiments have been disclosed in detail above, other embodiments are possible and the inventors intend these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other resistance sizes can be used, and other devices can be tested in this way.

Also, the inventors intend that only those claims which use the words "means for" are intended to be interpreted under 35 USC 112, sixth paragraph. Moreover, no limitations from the specification are intended to be read into any claims, unless those limitations are expressly included in the claims. The computers described herein may be any kind of computer, either general purpose, or some specific purpose computer such as a workstation. The computer may be a Pentium class computer, running Windows XP or Linux, or may be a Macintosh computer. The computer may also be a handheld computer, such as a PDA, cellphone, or laptop.

The programs may be written in C, or Java, Brew or any other programming language. The programs may be resident on a storage medium, e.g., magnetic or optical, e.g. the computer hard drive, a removable disk or media such as a memory stick or SD media, or other removable medium. The programs may also be run over a network, for example, with a server or other machine sending signals to the local machine, which allows the local machine to carry out the operations described herein.

What is claimed is:

1. A method, comprising:

physically and electrically attaching a remotely-controllable moving light that includes both a power connection and a signal connection to a separate interface board, where said interface board is separate from the moving light before said connecting, and said interface board is not part of the moving light, and where said interface board structurally supports the moving light and also provides a connection to both power and signal on the moving light, where said interface board has a connector that directly connects to the moving light, another connector that connects to a testing part, and a connection to a base of the moving light that is used to hang the moving light; and testing the moving light while the moving light is attached to said interface board in a way that the entire interface board moves with a base of the moving light, and where said testing includes moving at least a portion of the moving light other than the base relative to said interface board, while said moving light is attached to said interface board, and wherein said moving light is operable without said interface board in a non-testing mode.

2. A method as in claim 1, further comprising attaching to the interface board and using the attaching for moving the interface board to a first location in order to test the moving light at said first location, and to a second location different than the first location to test the moving light at the second location.

3. A method as in claim 2, wherein said moving the interface board comprises moving the interface board along a linearly-extending conveyable path.

4. A method as in claim 3, wherein said linearly extending conveyor includes a plurality of testing stations, and further comprising testing at said testing stations.

5. A method as in claim 1, further comprising attaching to the interface board, and using the attaching for moving the interface board to different orientations, where the entire moving light is moved to a different orientation in the different orientations of the interface board, and wherein said testing is carried out with said moving light in both of said different orientations of the interface board to test the moving light at both of said different orientations.

6. A method as in claim 1, wherein said attaching comprises mechanically attaching the moving light to the interface board, attaching a signal connector on the light to a connector on the interface board, and attaching a power connector on the light to a connector to the interface board, and connecting another connector on the interface board to a source of power and signal to the interface board.

7. A method as in claim 6, wherein said another connector is a different connector hookup format than connectors on the moving light.

8. A method as in claim 1, further comprising automatically determining information about the moving light that is connected to the interface board, and wherein said testing comprises testing based on characteristics determined by the automatically determining.

9. A system, comprising:
a linearly extending conveyable system, having a plurality of test stations therealong, each of said test stations having a first port adapted for providing both power and signal to a moving light, where said moving light has a base connection, and said moving light has a moving head that is connected to and controlled by electronics in said base connection to move in both pan and tilt directions, said first port being located at each of said test stations, and each of said test stations including a computer part that allows testing the moving light at said test stations by communicating with said computer part wherein said testing comprises causing said moving head to move in both said pan and tilt directions relative to said base connection; further comprising at least one interface board, which structurally holds a moving light thereon, and includes a first connector portion which provides a connection to power and signal for the moving light, and a second connector portion that connects to receive power and signal from one of said test stations, wherein said interface board is physically separate from said moving light before said structurally holding, and wherein said moving light is operable without said interface board in a non-testing mode, and where said interface board connects to parts of the moving light that are used to hang the moving light and testing of the moving light is carried out while the moving light is attached to said interface board in a way that the entire interface board moves with a base of the moving light.

10. A system as in claim 9, wherein said test stations further comprises a part that enables changing a mechanical orientation of the moving light during said testing.

11. A system as in claim 10, wherein said changing an orientation comprises changing the orientation of the moving light between a first orientation where the interface board is positioned vertically with and said moving head is above a base of the light, and a second orientation where the interface board is positioned tilted relative to the vertical, where both the moving head and the base are tilted.

12. A system as in claim 9, further comprising an automatic scanner that automatically scans said light and automatically determines information about said moving light based on a scanning.

13. A system as in claim 9, wherein said conveyor includes slats with air spaces therein, and further comprising at least one air based cleaning device along said conveyor, driving air between said slats of said cleaning device.

14. A method, comprising: physically and electrically attaching a moving light to an interface board that mechanically and electrically connects to the moving light, where the moving light is of a type that has a base connection, and said moving light also has a moving head that is connected to and controlled by electronics in said base connection and where said moving head moves in pan and tilt directions relative to said base connection where said interface board has a connector that directly connects to the moving light, another connector that connects to a testing part, and a connection to parts of the moving light that are used to hang the moving light;
attaching to the interface board using an external moving part, and using the external moving part to move interface board to mechanically move the moving light to another location,
where the interface board is moved by said external moving part being connected to the interface board, to orient the moving light in different orientations, including a first orientation where said moving head is above said base connection, and a second orientation where said moving head is below said base connection;
first testing the moving light in the first orientation where the moving head is above a base portion of the light; and
second, without removing the moving light from the interface board, testing the moving light in a second orientation where the moving head is oriented in said second orientation where said moving head is below said base connection.

15. A method as in claim 14, wherein said second orientation is one where the moving head is vertically below the base portion of the moving light.

16. A method as in claim 14, wherein said second orientation is one where the moving head is tilted at an angle relative to the moving light.

17. A method as in claim 14, wherein said first testing and said second testing occurs along a conveyable system.

* * * * *